（12）United States Patent
Gau

(10) Patent No.: US 6,329,255 B1
(45) Date of Patent: Dec. 11, 2001

(54) METHOD OF MAKING SELF-ALIGNED BIT-LINES

(75) Inventor: Jing-Horng Gau, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/620,230

(22) Filed: Jul. 20, 2000

(51) Int. Cl.[7] .................................................. H01L 21/336
(52) U.S. Cl. .......................... 438/299; 438/669; 438/720; 438/639
(58) Field of Search .................................. 438/299, 669, 438/720, 659, 639, 303

(56) References Cited

U.S. PATENT DOCUMENTS 5,907,781 * 5/1999 Chen et al. .
6,114,202 * 9/2000 Tseng .

* cited by examiner

Primary Examiner—Caridad Everhart
(74) Attorney, Agent, or Firm—Winston Hsu

(57) ABSTRACT

The present invention provides a method of making self-aligned bit-lines on a substrate, the surface of which comprises a dielectric layer having a plurality of node contact holes and bit-line contact holes. A first conducting layer is formed on the surface of the substrate, filling each node contact hole and bit-line contact hole. Next, a protecting layer is formed over the first conducting layer. The protecting layer and the first conducting layer are etched to form each node contact and bit-line contact. A spacer is formed around each node contact. A second dielectric layer is formed on the wafer, and then etched down to the first dielectric layer and to the surface of each bit-line contact, forming a trench in the second dielectric layer. A second conducting layer is formed on the surface of the substrate, filling each bit-line trench, and a back etching process is performed to remove the second conducting layer from the surface of the second dielectric layer and from each trench down to a certain depth, resulting in a bit-line. Finally, a third dielectric layer is formed on the surface of the substrate, filling each trench.

17 Claims, 7 Drawing Sheets

METHOD OF MAKING SELF-ALIGNED BIT-LINES

BACKGROUND OF THE INVENTION

1. Field of the Invention

The present invention provides a method for making a self-aligned bit-line on a substrate.

2. Description of the Prior Art

A dynamic random access memory (DRAM) comprises an enormous amount of memory cells, each of which comprises a metal oxide semiconductor (MOS) and a capacitor. Each MOS and capacitor link with bit-lines through word lines to determine the location of each memory cell.

The design of a capacitor of a memory cell is based on two electric pole layers. The upper layer is a field plate and the lower layer is a storage node. These layers are separated by a cell dielectric layer. When one electric pole layer is subjected to a voltage, an electric charge of the corresponding value is induced in the other electric pole layer. The data storing and retrieving functions are achieved in this way. The lower layer storage node, in the form of a node contact acting as a connecting line, connects electrically with the drain of a MOS to store and retrieve data.

In order to raise the density of DRAM, when making lower layer storage nodes of the DRAM, landing pads are generally used in forming node contacts, which connect the MOS and capacitor with bit-lines. However, with advances in wafer production, the size of dynamic memory cells is being designed smaller and smaller. For this reason, the improvement and control of DRAM production processes has become an important subject in the field.

Please refer to FIG. 1 to FIG. 4. FIGS. 1 to 4 show the fabrication processes of a lower layer storage node 28 of a capacitor according to the prior art. As shown in FIG. 1, a semiconductor wafer 10 comprises a substrate 12, a landing pad 16 located on the substrate 12, a first dielectric layer 14 deposited on the surfaces of the substrate 12 and the landing pad 16, two bit-lines 18 located on the first dielectric layer 14 for data transmission, and a second dielectric layer 23 deposited over the surfaces of the two bit-lines 18 and the first dielectric layer 14. The two bit-lines are covered by a metallic silicide layer 20, which lowers the contact resistance of the surfaces of the bit-lines 18.

As shown in FIG. 2, according to the prior art method for making a node contact hole 26, the manufacturer forms a photoresist layer 24 on the surface of the second dielectric layer 23, and uses a lithographic process to pattern the location of the node contact hole 26 by forming a hole 25 in the photoresist layer 24. Next, the manufacturer performs an etching process, using the photoresist layer 24 as a hard mask, vertically removing the second dielectric layer 23 and then the first dielectric layer 16 along the hole 25, forming a node contact hole 26 on the landing pad 16 between the two bit-lines 18.

As shown in FIG. 3, after removing the photoresist layer 24, the manufacturer deposits a doped polysilicon layer over the surface of the substrate 10, which fills the node contact hole 26, and, with an etching back process or a chemical mechanical polishing (CMP) process, levels the doped polysilicon layer in the node contact hole 26 with the second dielectric layer 23, forming a node contact 27.

And as shown in FIG. 4, the manufacturer then evenly deposits an amorphous silicon layer over the surface of the substrate 10, and with a photolithographic process and an etching process forms a lower layer storage node 28 on the top of the node contact hole 26. A hemi-spherical grain (HSG) process is performed to increase the surface area of the lower layer storage node 28.

FIG. 5 shows a misalignment that can occur when making the lower layer storage node 28 of a capacitor according to the prior art. When etching the amorphous silicon layer to make the storage node 28, if the pattern of the location is not accurately transferred during the photolithographic process, a misalignment occurs. This misalignment allows the doped polysilicon in the node contact hole 26 (the node contact 27) to be etched off during the etching of the amorphous silicon. This results in a recess 29, which causes an insufficient thickness of the ONO layer over the doped polysilicon 27 in the recess 29 during later processes when forming a cell dielectric layer of oxide-nitride-oxide (ONO) over the storage node 28. This, in turn, results in a low-quality product. Additionally, since the node contact 27 is made after the two bit-lines 18, the line width of the bit-lines 18 must be made very narrow to avoid misalignment during the formation of the node contact hole 26. Unfortunately, the narrowing of line width results in a high resistance in the bit-lines 18, which affects the transmission speed, and which may even interrupt data transmission in the bit-lines 18.

Moreover, as shown in FIGS. 1 to 4, the process for making the lower layer storage nodes 28 of the DRAM requires two photolithographic processes to define the location of the node contact hole 26 and the storage node 28. For this reason, a landing pad has to be made before hand, which increases the DRAM manufacturing cost. Furthermore, with the size of the substrate decreasing, the precision of the photolithographic pattern transfer is lowered, and the subsequent yield rate is thus lowered.

SUMMARY OF THE INVENTION

It is therefore a primary objective of the present invention to provide a method for making a self-aligned bit-line on a substrate. Another objective of the present invention is to eliminate the problem of misalignment that occurs when making storage nodes.

In the preferred embodiment, the surface of a semiconductor substrate has a dielectric layer, which has a plurality of node contact holes and bit-line contact holes. A first conducting layer is first formed over the surface of the substrate, filling each node contact hole and bit-line contact hole. A protection layer is then formed over the first conducting layer, and an etching process then etches the protecting layer and the first conducting layer so as to form each node contact and bit-line contact. Next, a spacer is formed around each node contact, and a second dielectric layer is deposited over the substrate. An etching process etches the second dielectric layer down to the first dielectric layer and down to the surface of each bit-line contact, forming a trench for each bit-line in the second dielectric layer. A second conducting layer is then deposited over the substrate, filling each bit-line trench. In an etching back process, the second conducting layer is removed from the surface of the second dielectric layer, and is partially removed the second conducting layer in the trench down to a certain depth, so as to form each bit-line. A third dielectric layer is deposited over the substrate, filling each bit-line trench, and a planarizing process levels the tops of the second dielectric layer and the third dielectric layer in each trench with the first conducting layer on top of each node contact. Finally, a storage node is made on top of each node contact.

In the present invention, bit-lines are formed based on a difference in height, which is created through the etching process of conducting layers, and the conducting layer left in the lower region assumes the function of a landing pad, so the entire manufacturing process is simplified and costs are reduced.

DETAILED DESCRIPTION OF THE PRESENT INVENTION

Figure 1:
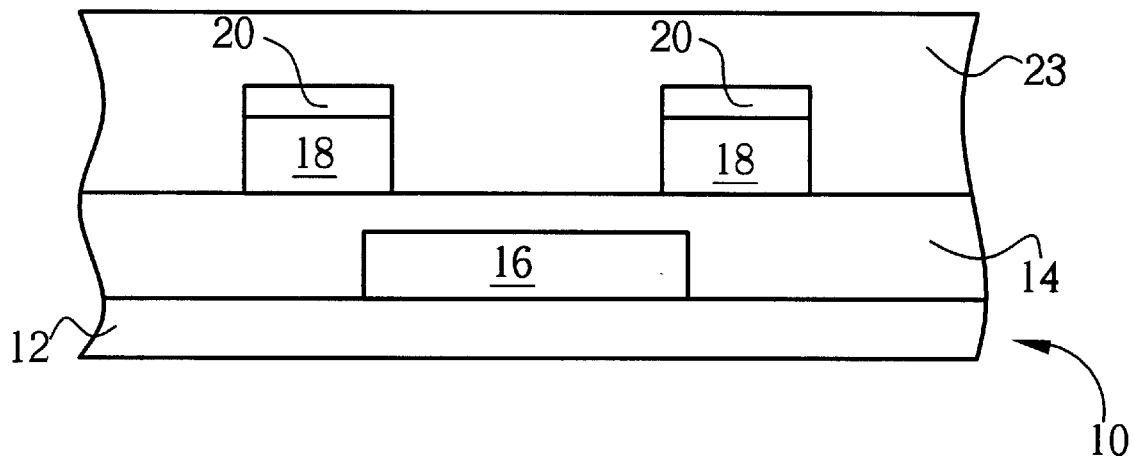
FIGS. 1 to 4 are process views for making a lower layer storage node of a capacitor according to the prior art.
Figure 2:
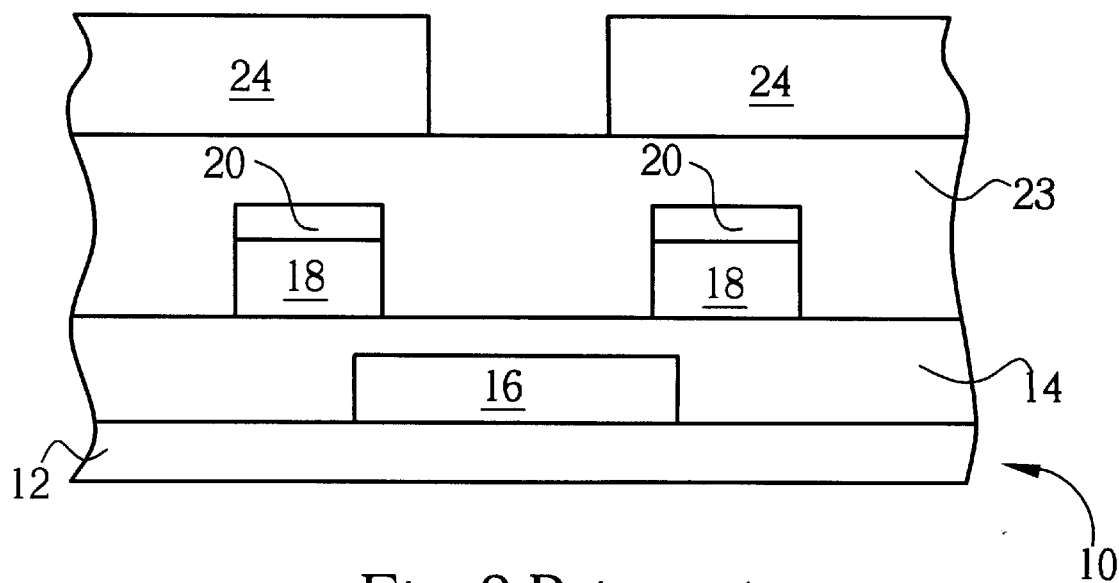
Figure 3:
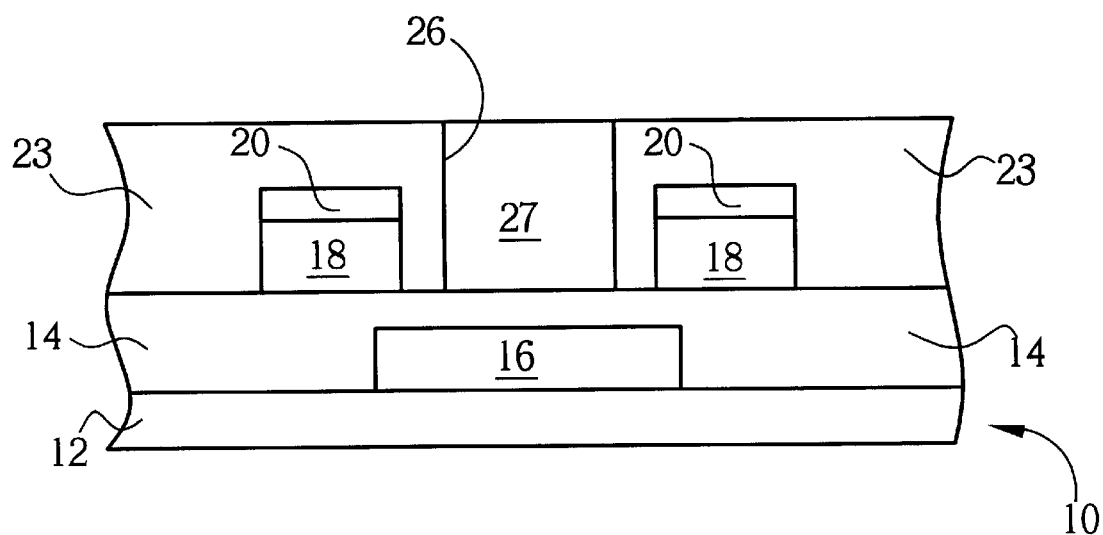
Figure 4:
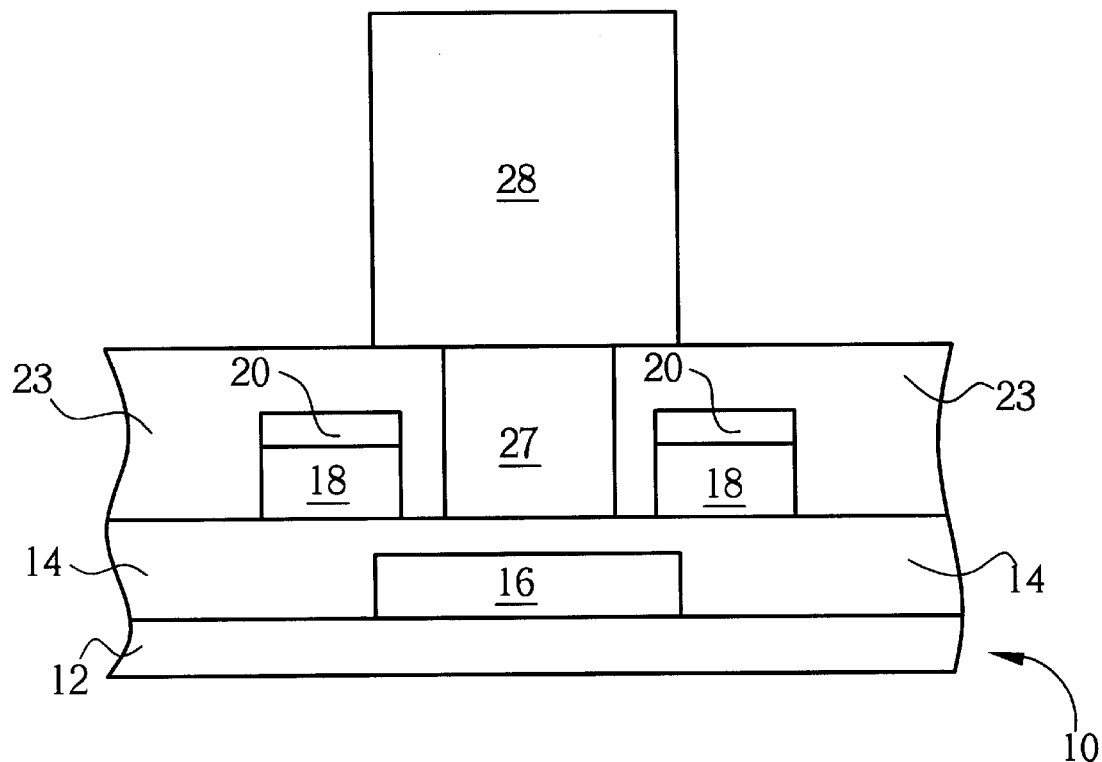
Figure 5:
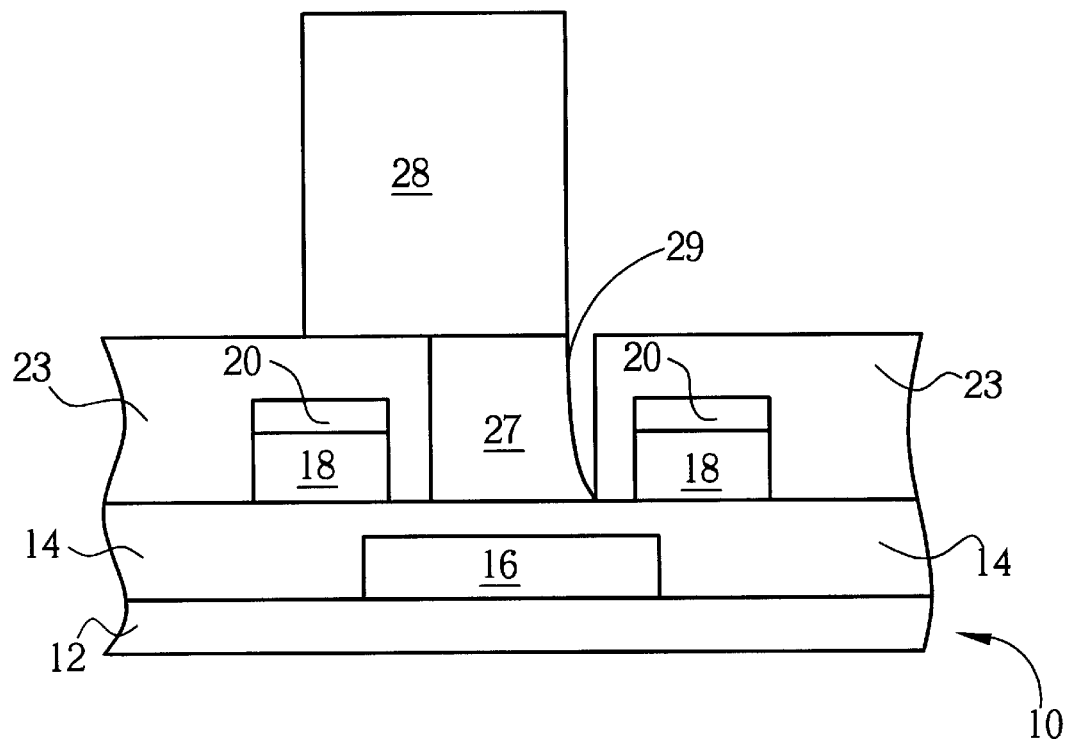
FIG. 5 is a view of misalignment that occurs when making a lower layer storage node of a capacitor according to the prior art.
Figure 6:
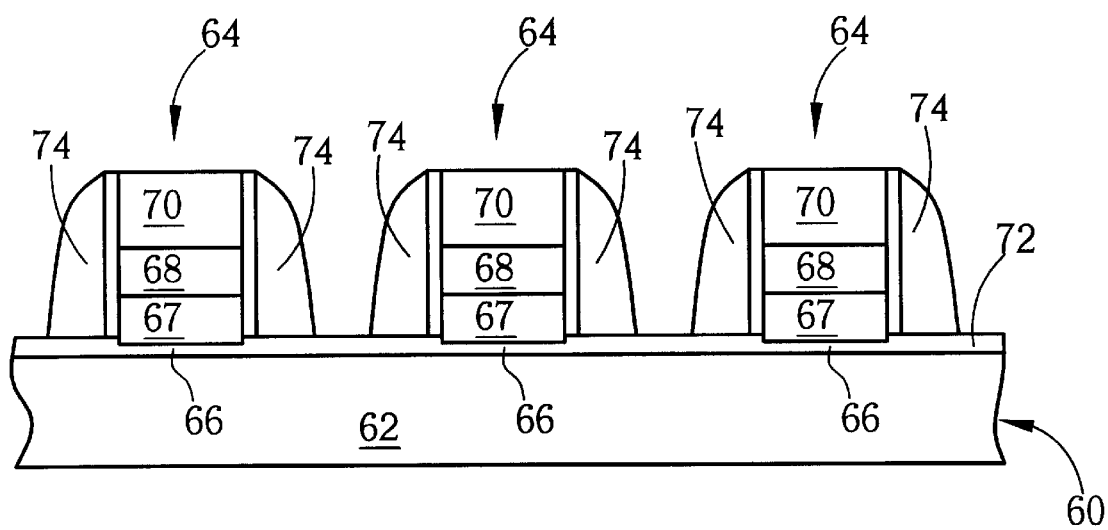
FIGS. 6 to 13 are views of the manufacturing processes of a bit-line and storage node according to the present invention.

Please refer to FIGS. 6 to 13. FIGS. 6 to 13 are views of the manufacturing processes of a bit-line and storage node according to the present invention. As shown in FIG. 6, a semiconductor wafer 60 comprises a substrate 62, a plurality of word-lines 64 located on top of the substrate 62, and a plurality of MOS transistors (not shown), each of which is located in each word-line 64. Each word line 64 comprises a gate oxide layer 66, a doped polysilicon layer 67, a metallic silicide layer 68 and a cap layer 70. Along the walls of each word-line 64 are a liner oxide 72 and a spacer 74.

Figure 7:
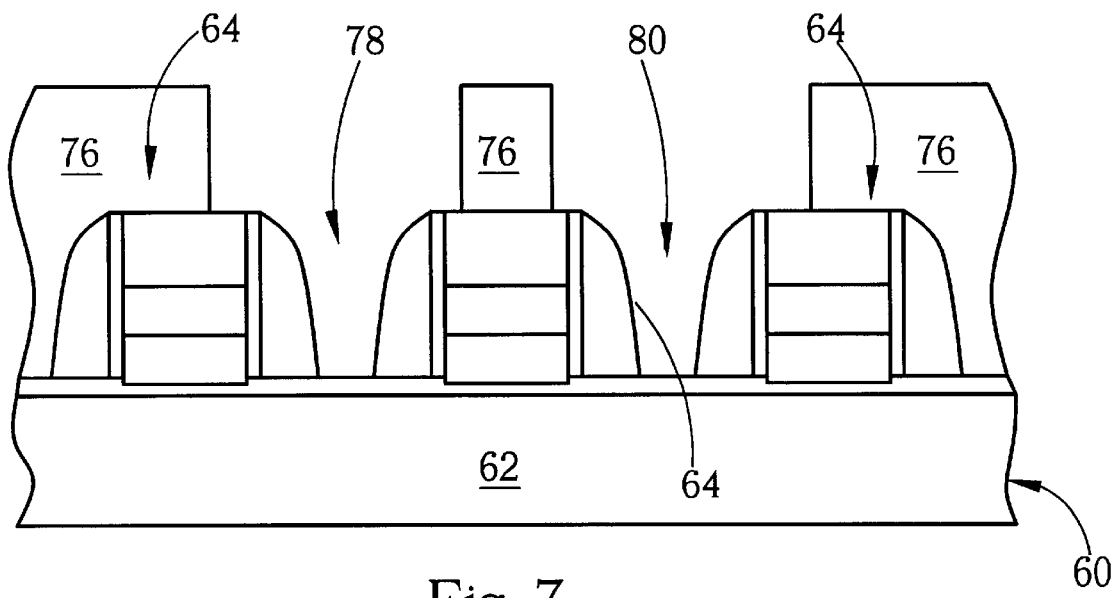

As shown in FIG. 7, the manufacturing process begins with a chemical vapor deposition (CVD) process. A first dielectric layer 76 of silicon oxide is uniformly deposited over the surface of the substrate 60. Next, a first dielectric layer 76 with a first photoresist layer (not shown) is coated onto the semiconductor wafer 60. A first lithographic process transfers the pattern of each node contact hole 80 and bit-line contact hole 78 to the first photoresist layer. Next, using the first photoresist layer, the cap layer 70 and the spacer 74 as hard masks, an etching process is performed, which etches out each contact hole 80 and bit-line contact hole 78 in the first dielectric layer 76, until reaching the surface of the substrate 62.

Figure 8:
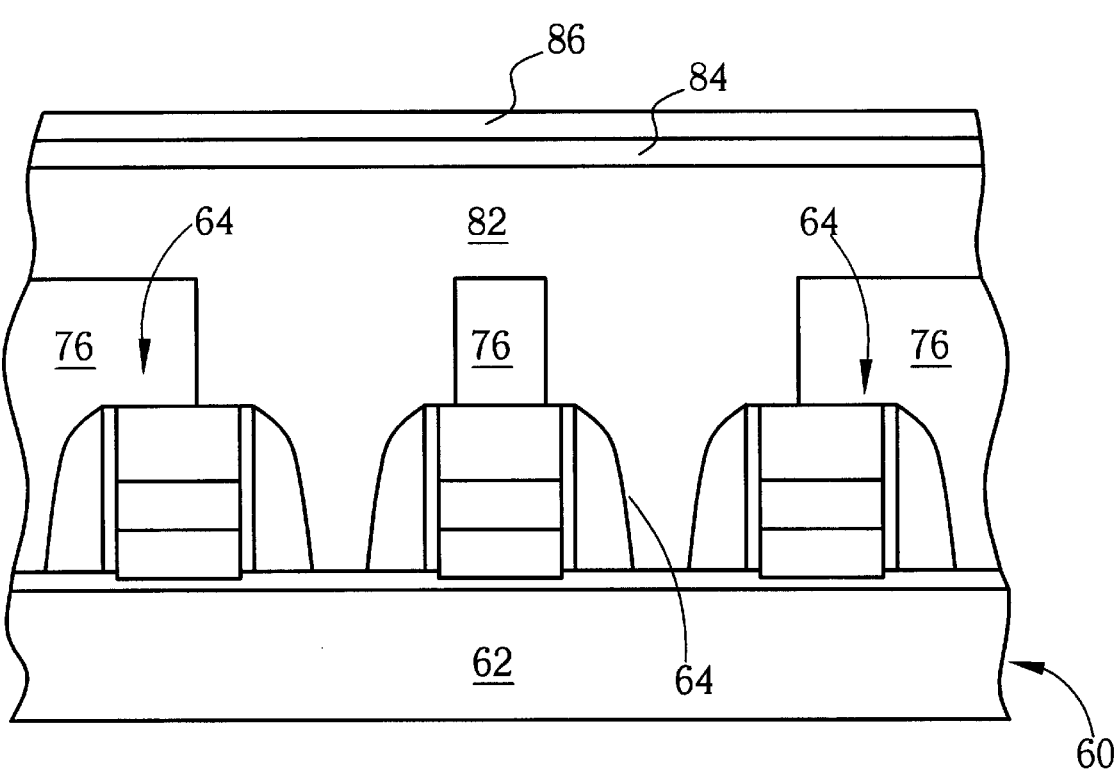

As shown in FIG. 8, after removing the first photoresist layer, a doped polysilicon layer is deposited onto the surface of the substrate 60 to serve as the first conducting layer 82. The first conducting layer 82 fills each node contact hole 80 and bit-line contact hole 78. Then, in order, over the first conducting layer 82 are formed a metallic silicide layer 84, a protecting layer 86 of silicon nitride and a second photoresist layer (not shown). A second lithographic process is performed to transfer to the second photoresist layer the position of each node contact, which is above each node contact hole 80.

Figure 9:
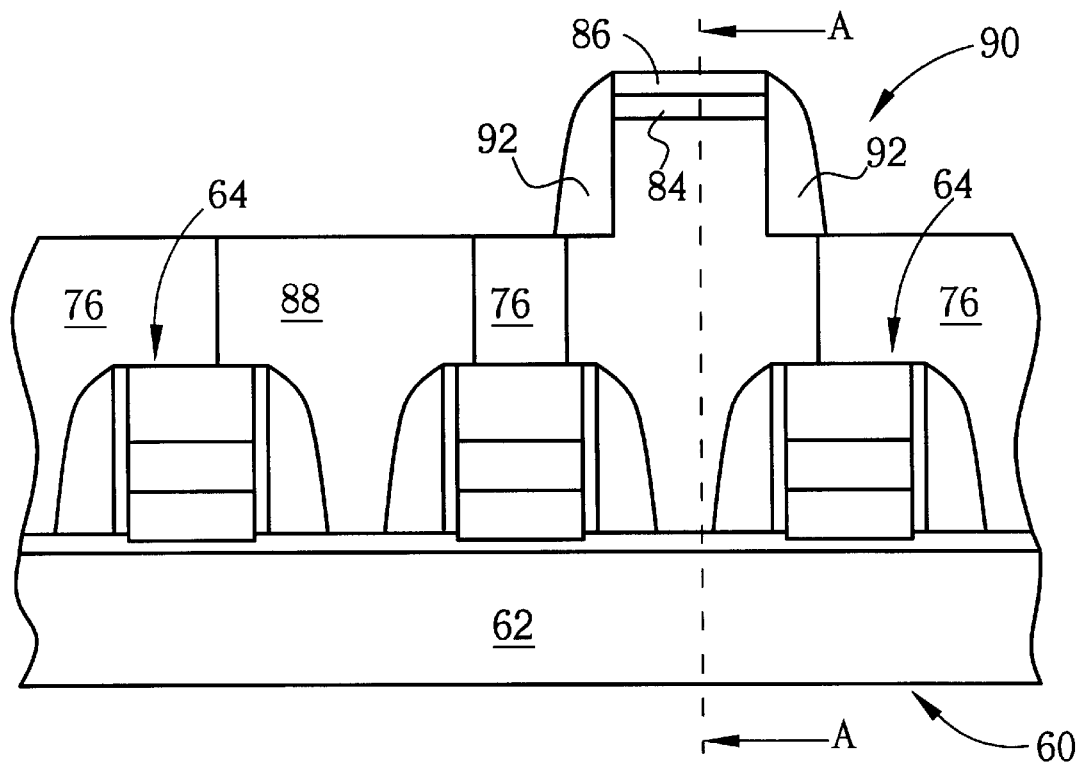

As shown in FIG. 9, using the second photoresist layer as a hard mask, another etching process is performed on the protecting layer 86 and the first conducting layer 82, etching them down to the first dielectric layer 76 to form a node contact 90 and a bit-line contact 88. Next, after removing the second photoresist layer, a silicon nitride layer (not shown) is formed over the semiconductor wafer 60, and then an etching back process is performed to form a spacer 92 around the node contact 90.

Next, a dual damascene process is performed to make each bit-line. FIGS. 6 to 9 are rotated horizontally by 90 degree to give better views of the following manufacturing process, which is shown in FIGS. 10 to 13.

Figure 10:
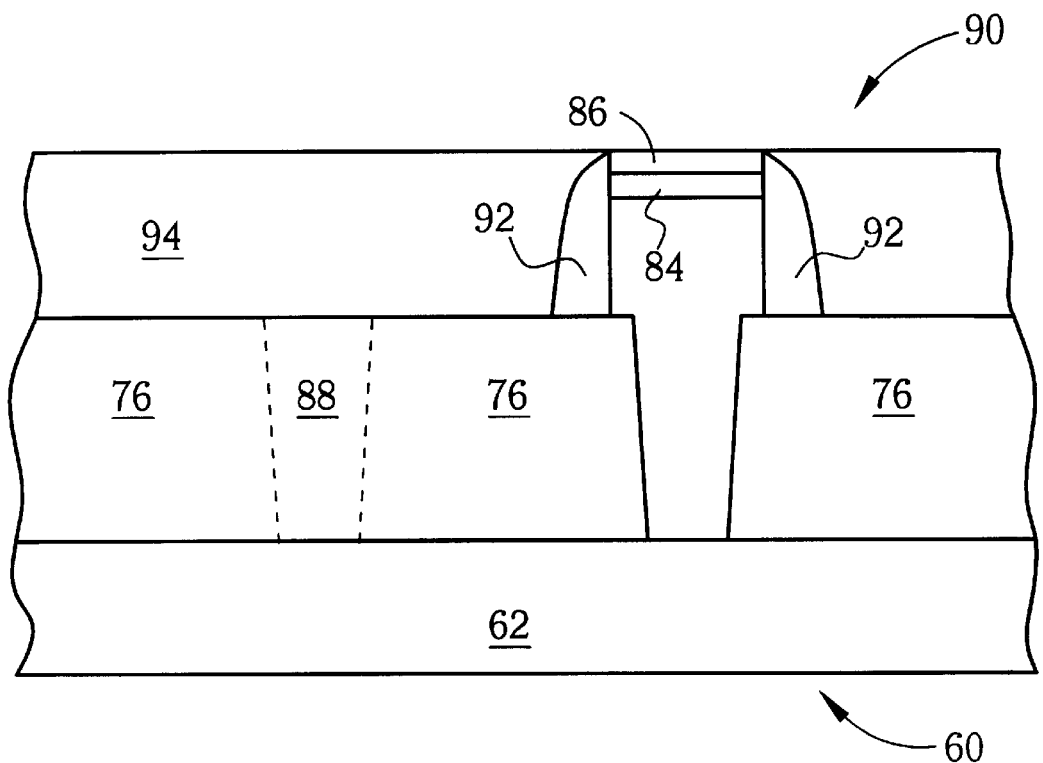

As shown in FIG. 10, a second dielectric layer 94 is formed over the semiconductor wafer 60, and a CMP planarization process is then performed. The protecting layer 86 on the top of the node contact 90 acts as a stop layer, and the planarization process removes a portion of the second dielectric layer 94 down to the height of the protecting layer 86 on the node contact 90.

Figure 11:
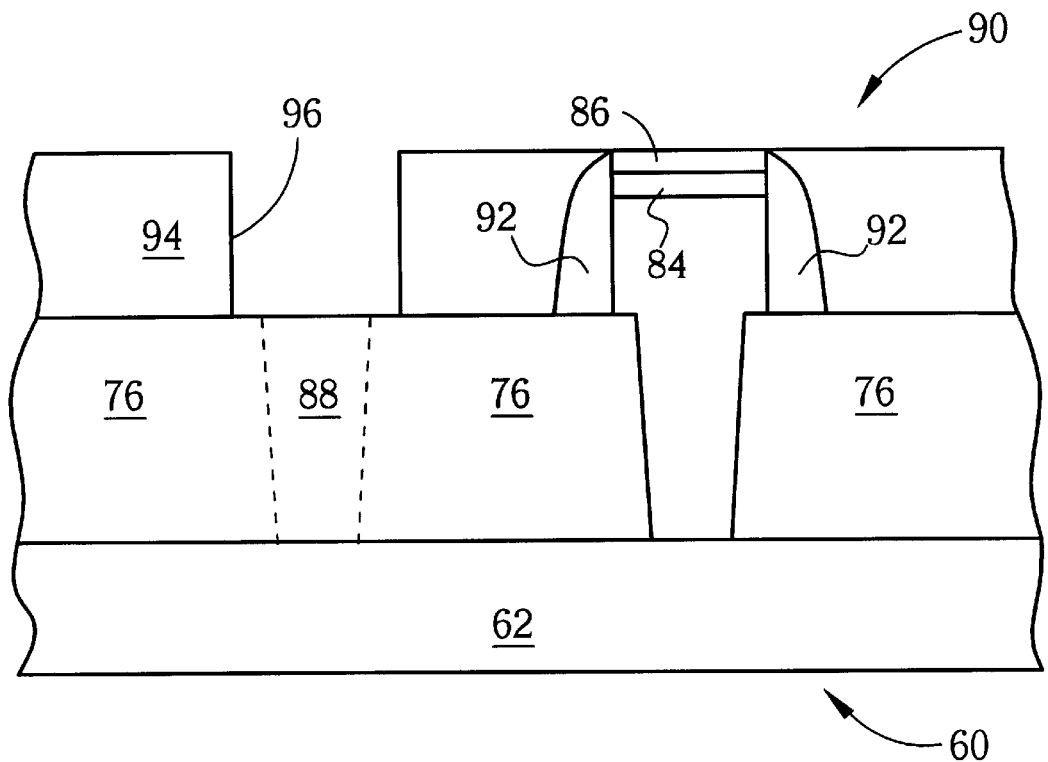

As shown in FIG. 11, a third photoresist layer (not shown) is formed over the second dielectric layer 94, and a third lithographic process is performed to transfer the position of each bit-line to the third photoresist layer. With the third photoresist layer as a hard mask, the second dielectric layer 94 is etched down to the top of the first dielectric layer 76 and to the top of each bit-line contact 88, resulting in a trench 96 in the second dielectric layer.

Figure 12:
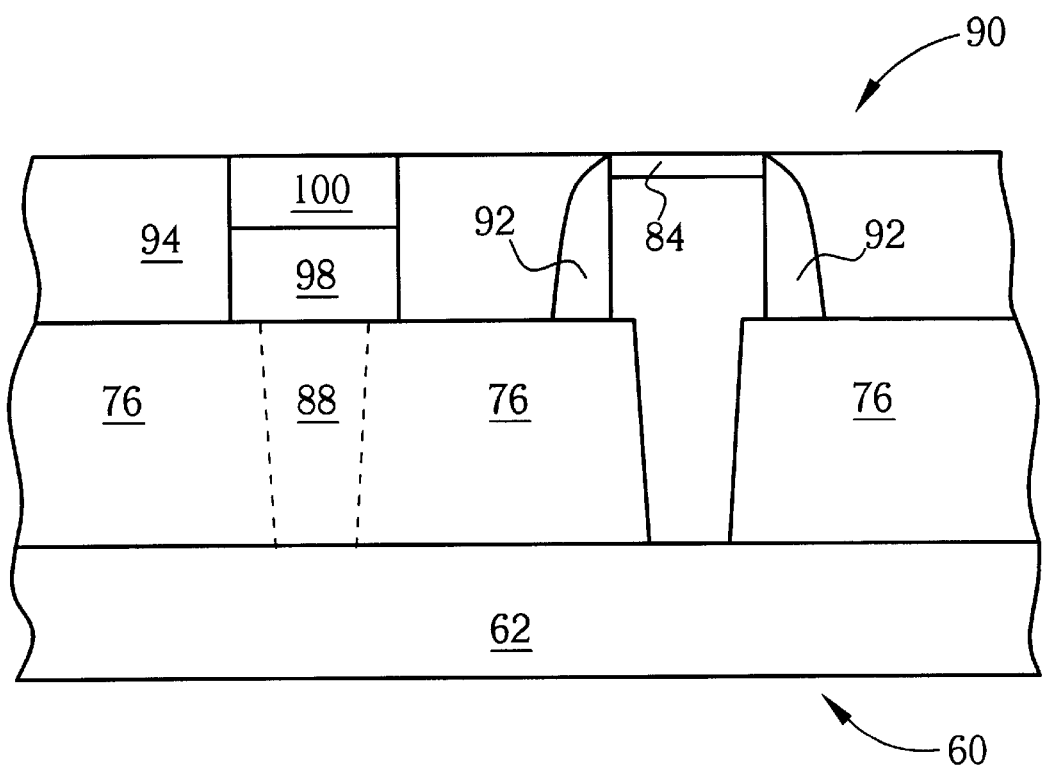

As shown in FIG. 12, after removing the third photoresist layer, a second conducting layer (not shown) comprising a doped polysilicon layer and a metallic silicon layer is formed over the surface of the semiconductor wafer 60, which fill the trench 96. Another etching back process removes the second conducting layer from the surface of the second dielectric layer 94 and partially from the trench 96 down to a certain depth, resulting in a bit-line 98. A third dielectric layer is deposited over the semiconductor wafer 60 to fill the trench 96, and then a second planarization process is performed to trim the second dielectric layer 94, the third dielectric layer 100 and the protecting layer 86, so as to level them with the metallic silicon layer 84 on top of the node contact 90.

Figure 13:
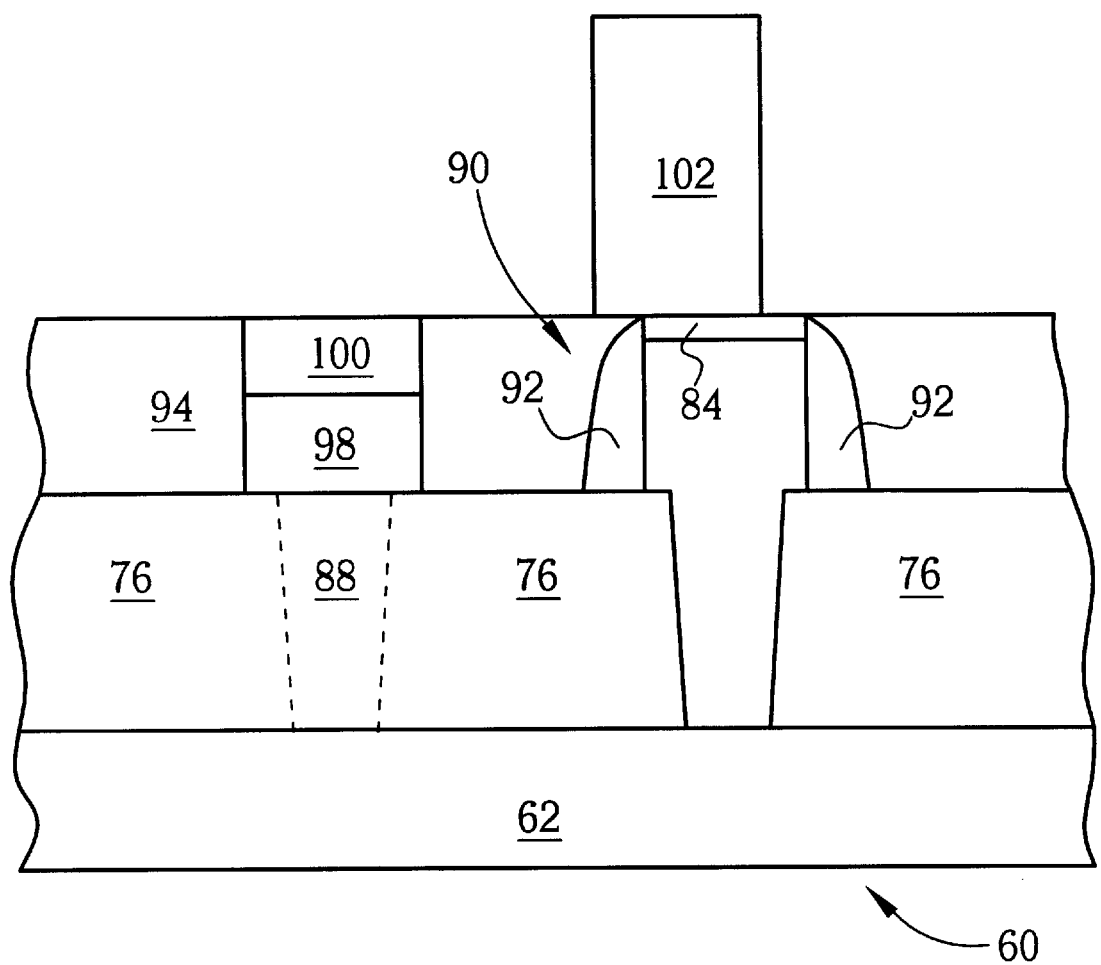

As shown in FIG. 13, a third conducting layer (not shown) comprising amorphous silicon or doped polysilicon is formed over the surface of the semiconductor wafer 60. A third photoresist layer (not shown) is then formed on the third conducting layer. A third lithographic process transfers the pattern of each storage node to the third photoresist layer. Next, using the third photoresist layer as a hard mask, the third conducting layer is etched down to the second dielectric layer 94, to the third dielectric layer 100, and to the surface of the metallic silicon layer, forming a storage node 102 above the node contact 90.

Since the present method utilizes a borderless contact structure to shorten the distances between the node contact hole 80, the bit-line contact hole 82 and each MOS, the surface area of the substrate is efficiently used, and the problem of misalignment is avoided. Additionally, by using the depositing and etching processes to form the node contact 90 and the bit-line contact 88, the difficult problem of etching or filling a node contact hole, which has a big height-to-width aspect ratio, is avoided, and the use of the landing pad 16 needed in the prior method is eliminated. In the present invention, both the spacer 92 formed around the node contact 90 and the protecting layer 92 act as hard masks in the later etching process for the trench 96, thus avoiding the problem of misalignment during a photolithographic process.

Moreover, in the etching process for the storage node 102, the metallic silicide layer 84 on top of the node contact 90 can be used as a protective layer in photolithography, increasing the etching precision, avoiding photolithographic misalignment, and further avoiding the problem of a recess, which is formed in the doped polysilicon layer (the node contact 90) in the node contact hole 80 during the etching process of the third conducting layer.

In comparison to the prior art, the present invention not only avoids misalignment, which is caused by the imprecision of the pattern transfer in a photolithographic process, but also uses the spacer 92 formed around the node contact 90 and the protecting layer 86 to self-align the bit-line 98 and to expand its line-width, reducing resistance and increasing transmission speeds. Additionally, the present method simplifies the manufacturing process for bit-lines and storage nodes, increases the misalignment tolerance in each etching process, and increases the efficiency of the semiconductor wafer manufacturing process.

The above disclosure is based on the preferred embodiment of the present invention. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for making self-aligned bit-lines on a semiconductor wafer, the semiconductor wafer comprising a first dielectric layer, the first dielectric layer comprising a plurality of node contact holes and bit-line contact holes, the method comprising:

forming a first conducting layer over the surface of the semiconductor wafer, the first conducting layer filling each node contact hole;

forming a protective layer and a first photoresist layer over the first conducting layer;

performing a first lithographic process to transfer node contact patterns to the first photoresist layer, each node contact pattern located above a corresponding node contact hole;

etching the protective layer and the first conducting layer, using the first photoresist layer as a hard mask, down to the first dielectric layer to form each node contact and bit-line contact;

removing the first photoresist layer;

forming a spacer around each node contact;

forming a second dielectric layer over the surface of the substrate;

forming a second photoresist layer over the second dielectric layer;

performing a second lithographic process to transfer bit-line contact patterns to the second photoresist layer;

etching the second dielectric layer down to the first dielectric layer and the surface of each bit-line contact, using the pattern of the second photoresist layer as a hard mask, so as to form a trench for each bit-line contact in the second dielectric layer;

removing the second photoresist layer;

forming a second conducting layer over the surface of the semiconductor wafer, the second conducting layer filling each trench;

performing an etching back process to remove the second conducting layer from the top of the second dielectric layer, and to partially remove the second conducting layer from each trench down to a certain depth, so as to form each bit-line; and forming a third dielectric layer over the surface of the semiconductor wafer to fill each bit-line trench.

2. The method of claim 1 wherein the first conducting layer is comprised of doped polysilicon.

3. The method of claim 2 wherein the first conducting layer has a metallic silicide layer over the doped polysilicon layer.

4. The method of claim 1 wherein the protective layer is comprised of silicon nitride.

5. The method of claim 1 wherein the spacer is comprised of silicon nitride.

6. The method of claim 1 wherein after the second dielectric layer is formed, a planarization process is performed, the protective layer on each node contact acting as a stop layer, to the planarization process leveling the second dielectric layer with the protective layer on the top of each node contact.

7. The method of claim 1 wherein the second conducting layer is comprised of doped polysilicon, metallic silicide, or a metal.

8. The method of claim 1 wherein after the third dielectric layer is formed, the method includes:

performing a second planarization process to remove a portion of the second dielectric layer and the third dielectric layer so as to level the second dielectric layer and the third dielectric layer in each trench with each first conducting layer on each node contact; and forming a storage node on each node contact.

9. The method of claim 8 wherein the second planarization process removes the protective layer from the top of each node contact, exposing the first conducting layer on the top of each node contact.

10. A method for making self-aligned bit-lines on a substrate, the substrate comprising a first dielectric layer, the first dielectric layer comprising a plurality of node contact holes and bit-line contact holes, the method comprising:

forming a first conducting layer over the surface of the substrate, the first conducting layer filling each node contact hole;

forming a protective layer and a first photoresist layer over the first conducting layer;

performing a first lithographic process to transfer node contact patterns to the first photoresist layer, each node contact pattern located above a corresponding node contact hole;

etching the protective layer and the first conducting layer down to the first dielectric layer, using the first light resisting layer as a hard mask, to form each node contact and bit-line contact;

removing the first photoresist layer;

forming a spacer around each node contact;

forming a second dielectric layer over the surface of the substrate;

forming a second photoresist layer over the second dielectric layer;

performing a second lithographic process to transfer bit-line contact patterns to the second photoresist layer;

etching the second dielectric layer down to the first dielectric layer and the surface of each bit-line contact, using the pattern of the second photoresist layer as a hard mask, so as to form a trench for each bit-line contact in the second dielectric layer;

removing the second photoresist layer;

forming a second conducting layer over the surface of the substrate, the second conducting layer filling each trench;

performing an etching back process to remove the second conducting layer from the top of the second dielectric layer, and to partially remove the second conducting layer from each trench down to a certain depth, so as to form each bit-line;

forming a third dielectric layer over the surface of the substrate, the third dielectric layer filling each bit-line trench;

performing a first planarization process to remove the third dielectric layer and the protective layer from the second dielectric layer, so as to level the height of the second dielectric layer and the third dielectric layer in each trench with the height of the first conducting layer on each node contact;

forming a third conducting layer over the surface of the substrate;

forming a third photoresist layer over the third conducting layer;

performing a third lithographic process to transfer storage node patterns to the third photoresist layer; and etching the third conducting layer down to the second dielectric layer, the third dielectric layer, and the third conducting layer, so as to form a storage node above each node contact.

11. The method of claim 10 wherein the first conducting layer is comprised of doped polysilicon.

12. The method of claim 11 wherein the first conducting layer comprises a metallic silicide layer formed on top of the doped polysilicon.

13. The method of claim 12 wherein the metallic silicide layer functions to lower the contact resistance of each node contact, and serves as a protective layer for each node contact in an etching process, to the metallic silicide layer preventing the node contact from damage during the storage node etching process.

14. The method of claim 10 wherein the protective layer is comprised of silicon nitride.

15. The method of claim 10 wherein the spacer is comprised of silicon nitride.

16. The method of claim 10 wherein after the second dielectric layer is formed, a second planarization process is performed to level the second dielectric layer with the protective layer above the node contact.

17. The method of claim 10 wherein the second conducting layer is comprised of doped polysilicon or metallic silicide.

* * * * *